United States Patent
Kanematsu et al.

(10) Patent No.: US 12,376,416 B2
(45) Date of Patent: Jul. 29, 2025

(54) METHOD FOR MANUFACTURING SOLAR CELL

(71) Applicant: KANEKA CORPORATION, Osaka (JP)

(72) Inventors: Masanori Kanematsu, Settsu (JP); Katsunori Konishi, Settsu (JP)

(73) Assignee: KANEKA CORPORATION, Osaka (JP)

( * ) Notice: Subject to any disclaimer, the term of this patent is extended or adjusted under 35 U.S.C. 154(b) by 489 days.

(21) Appl. No.: 17/825,877

(22) Filed: May 26, 2022

(65) Prior Publication Data

US 2022/0293804 A1 Sep. 15, 2022

Related U.S. Application Data

(63) Continuation of application No. PCT/JP2020/041594, filed on Nov. 6, 2020.

(30) Foreign Application Priority Data

Nov. 27, 2019 (JP) .................................. 2019-214677

(51) Int. Cl.
*H10F 77/20* (2025.01)
*H10F 71/00* (2025.01)

(52) U.S. Cl.
CPC ....... *H10F 77/219* (2025.01); *H10F 71/1385* (2025.01); *H10F 77/247* (2025.01)

(58) Field of Classification Search
CPC .. H10F 77/219; H10F 71/1385; H10F 77/247; H10F 10/166
See application file for complete search history.

(56) References Cited

U.S. PATENT DOCUMENTS

| 6,998,288 | B1* | 2/2006 | Smith | ............... H01L 31/0682 |
| | | | | 438/57 |
| 7,468,485 | B1* | 12/2008 | Swanson | ............ H01L 31/182 |
| | | | | 136/243 |

(Continued)

FOREIGN PATENT DOCUMENTS

| CN | 104854708 A | 8/2015 |
| JP | 2013-131586 A | 7/2013 |

(Continued)

OTHER PUBLICATIONS

An Office Action mailed by China National Intellectual Property Administration on Aug. 8, 2023, which corresponds to Chinese Patent Application No. 202080082584.5 and is related to U.S. Appl. No. 17/825,877; with English language translation.

(Continued)

*Primary Examiner* — Su C Kim
(74) *Attorney, Agent, or Firm* — Studebaker Brackett PLLC

(57) ABSTRACT

A method for manufacturing a solar cell which simplifies the formation of a transparent electrode layer. The method includes forming conductive semiconductor layers on the back surface side of a substrate, forming a transparent conductive film on the conductive semiconductor layers, forming an uncured film of a metal electrode layer on the conductive semiconductor layers, patterning the transparent conductive film to form transparent electrode layers, and forming the metal electrode layers, in this order. In the metal electrode layer uncured film forming, a printing material is printed and dried to form the uncured film of the metal electrode layer; in the transparent electrode layer forming, the uncured film of the metal electrode layer is used as a mask to pattern the transparent conductive film; and in the metal electrode layer forming, the uncured film of the metal electrode layer is fired and cured to form the metal electrode layers.

20 Claims, 8 Drawing Sheets

(56) References Cited

U.S. PATENT DOCUMENTS

| | | | | |
|---|---|---|---|---|
| 7,812,250 | B2* | 10/2010 | Smith | H01L 31/02363 136/255 |
| 8,134,217 | B2* | 3/2012 | Rim | H01L 31/068 257/431 |
| 8,354,143 | B2* | 1/2013 | Halsey, IV | G06F 3/0445 427/372.2 |
| 8,647,911 | B2* | 2/2014 | Smith | H01L 31/0682 438/57 |
| 8,802,486 | B2* | 8/2014 | Li | H01L 31/0682 438/98 |
| 2008/0067622 | A1* | 3/2008 | Bui | H01L 31/035281 438/444 |
| 2013/0137210 | A1 | 5/2013 | Cheng | |
| 2016/0043256 | A1 | 2/2016 | Nagano | |
| 2016/0126399 | A1 | 5/2016 | Hino et al. | |

FOREIGN PATENT DOCUMENTS

| | | |
|---|---|---|
| JP | 2013-239476 A | 11/2013 |
| JP | 2015-122347 A | 7/2015 |
| JP | 2016-039200 A | 3/2016 |
| JP | 2019-169599 A | 10/2019 |

OTHER PUBLICATIONS

International Search Report issued in PCT/JP2020/041594; mailed Jan. 19, 2021.

* cited by examiner

METHOD FOR MANUFACTURING SOLAR CELL

CROSS-REFERENCE TO RELATED APPLICATIONS

This application claims benefit of priority to International Patent Application No. PCT/JP2020/041594, filed Nov. 6, 2020, and to Japanese Patent Application No. 2019-214677, filed Nov. 27, 2019, the entire contents of each are incorporated herein by reference.

BACKGROUND

Technical Field

The present disclosure relates to a method of manufacturing a back electrode type (back contact type) solar cell.

Background Art

As a solar cell using a semiconductor substrate, there are solar cells of the bifacial electrode type and solar cells of the back electrode type. In the solar cell of the bifacial electrode type, electrodes are formed on both surfaces of the light receiving surface side and the back surface side. In the solar cell of the back electrode type, the electrode is formed only on the back surface. In the solar cell of the bifacial electrode type, the electrodes are provided on the light receiving surface side, therefore, sunlight is shielded by the electrodes. On the other hand, in the solar cell of the back electrode type, the electrodes are not provided on the light receiving surface side, therefore, the light receiving rate of sunlight is higher than that of the solar cell of the bifacial electrode type. Japanese Unexamined Patent Application, Publication No. 2013-131586 discloses a back electrode type solar cell.

The solar cell disclosed in Japanese Unexamined Patent Application, Publication No. 2013-131586 includes a semiconductor substrate, a first conductivity type semiconductor layer and a first electrode layer, and a second conductivity type semiconductor layer and a second electrode layer. The first conductivity type semiconductor layer and the first electrode layer are stacked in order on the back surface side of the semiconductor substrate. The second conductivity type semiconductor layer and the second electrode layer are stacked in order in other portions of the back surface side of the semiconductor substrate. The first electrode layer and the second electrode layer are separated from each other to prevent a short circuit.

SUMMARY

Generally, each of the first electrode layer and the second electrode layer includes a transparent electrode layer and a metal electrode layer. The metal electrode layer can be relatively easily separated and formed by, for example, a screen printing method using a silver paste. On the other hand, the transparent electrode layer needs to be formed separately by, e.g., photolithography using a mask, so the forming process is relatively complicated.

Accordingly, the present disclosure provides a method of manufacturing a solar cell capable of simplifying the formation of a transparent electrode layer.

A method of manufacturing a solar cell according to the present disclosure relates to a method of manufacturing a back electrode type solar cell. The back electrode type solar cell includes a semiconductor substrate, a first conductivity type semiconductor layer and a second conductivity type semiconductor layer disposed on one main surface side of the semiconductor substrate, a first transparent electrode layer and a first metal electrode layer corresponding to the first conductivity type semiconductor layer, and a second transparent electrode layer and a second metal electrode layer corresponding to the second conductivity type semiconductor layer. The manufacturing method includes, in order as follows: a semiconductor layer forming step including forming the first conductivity type semiconductor layer on a portion of the one main surface side of the semiconductor substrate, and forming the second conductivity type semiconductor layer on the other portion of the one main surface side of the semiconductor substrate; and a transparent conductive film forming step including forming a transparent conductive film on and across the first conductivity type semiconductor layer and the second conductivity type semiconductor layer. The manufacturing method further includes, in order as follows: a metal electrode layer uncured film forming step including forming a uncured film of the first metal electrode layer on the first conductivity type semiconductor layer with the transparent conductive film interposed therebetween, and forming a uncured film of the second metal electrode layer on the second conductivity type semiconductor layer with the transparent electrode layer interposed therebetween; a transparent electrode layer forming step including patterning the transparent conductive film to form the first transparent electrode layer and the second transparent electrode layer separated from each other; and a metal electrode layer forming step including forming the first metal electrode layer and the second metal electrode layer. The metal electrode layer uncured film forming step further includes printing and drying a printing material containing a particulate metal material, a resin material, and a solvent to form a uncured film of the first metal electrode layer and a uncured film of the second metal electrode layer. The transparent electrode layer forming step further includes patterning the transparent conductive film using the uncured film of the first metal electrode layer and the uncured film of the second metal electrode layer as masks. The metal electrode layer forming step further includes firing and curing the uncured film of the first metal electrode layer and the uncured film of the second metal electrode layer to form the first metal electrode layer and the second metal electrode layer.

According to the present disclosure, it is possible to simplify the formation of the transparent electrode layer of a solar cell.

DETAILED DESCRIPTION

Figure 1:
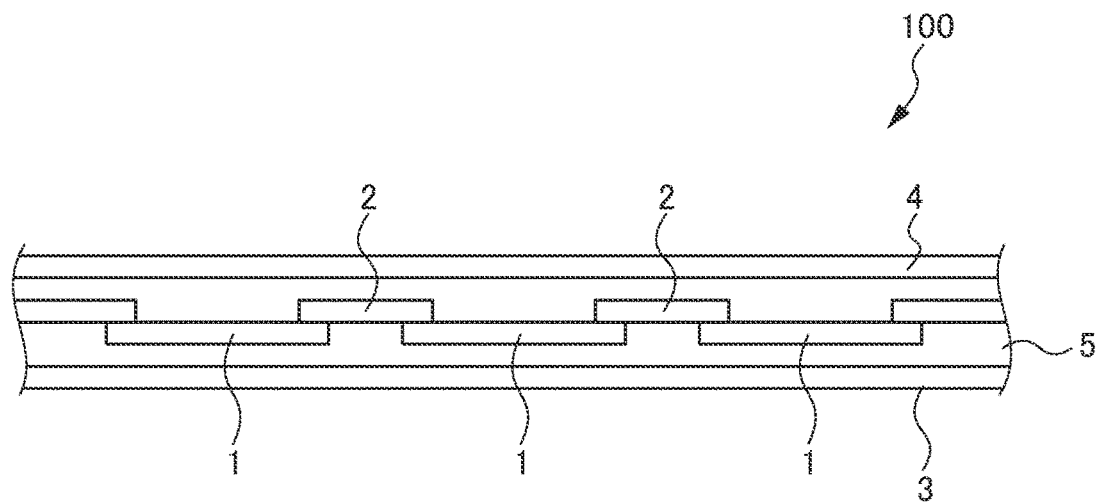
FIG. 1 is a side view showing an example of a solar cell module according to the present embodiment.

Hereinafter, an example of an embodiment of the present disclosure will be described with reference to the attached drawings. Incidentally, the same reference numerals shall be used for the same or corresponding parts in the drawings. For convenience, hatching, member symbols, and the like may be omitted. In such a case, reference shall be made to the other drawings.

Solar Cell Module

FIG. 1 is a side view showing an example of a solar cell module according to the present embodiment. A solar cell module 100 includes a plurality of solar cells 1 arranged in a two-dimensional shape.

The solar cells 1 are connected in series and/or in parallel by wiring members 2. More specifically, the wiring members 2 are each connected to a bus bar portion (described later) in an electrode layer of the solar cell 1. The wiring member 2 is, for example, a known interconnector such as a tab.

The solar cell 1 and the wiring member 2 are sandwiched between a light receiving surface protection member 3 and a back surface protection member 4. A liquid or solid sealing material 5 is filled between the light receiving surface protecting member 3 and the back surface protection member 4 such that the solar cell 1 and the wiring member 2 are sealed. The receiving surface protection member 3 is, for example, a glass substrate. The back surface protection member 4 is a glass substrate or a metal plate. The sealing material 5 is, for example, a transparent resin. Hereinafter, the solar cell 1 will be described in detail.

Solar Cells

Figure 2:
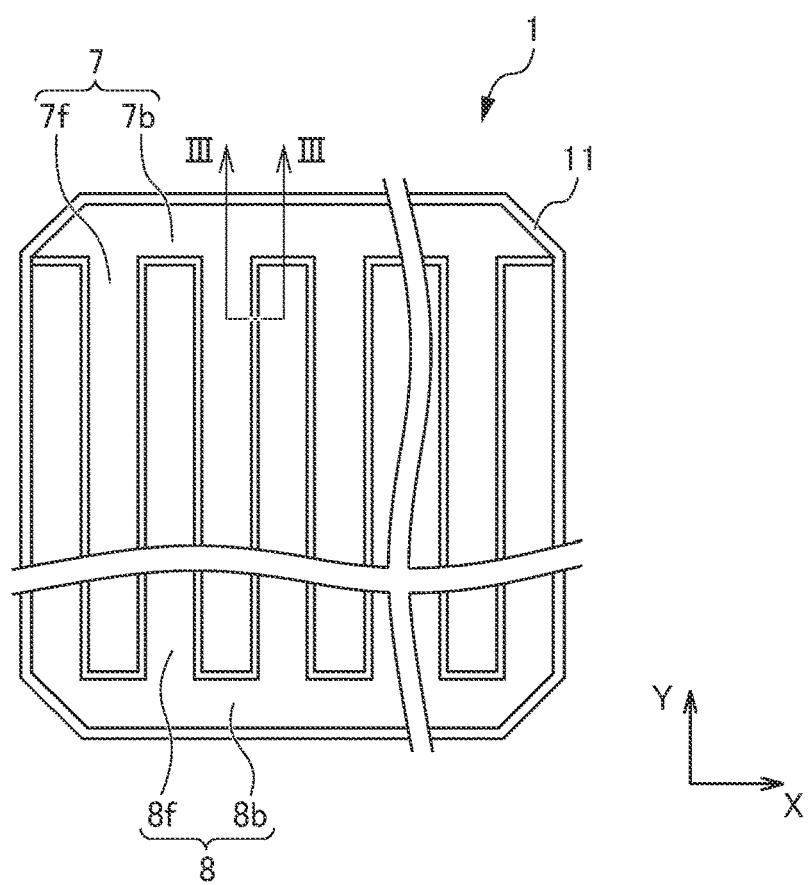
FIG. 2 is a view of a solar cell according to the present embodiment as viewed from the back surface side.

FIG. 2 is a view of a solar cell according to the present embodiment as viewed from the back surface side. The solar cell 1 shown in FIG. 2 is a back electrode type solar cell. The solar cell 1 includes a semiconductor substrate 11 having two main surfaces. The solar cell 1 further includes a first conductivity type region 7 and the second conductivity type region 8 in the main surface of the semiconductor substrate 11.

The first conductivity type region 7 has a so-called comb shape. The first conductivity type region 7 further includes a plurality of finger portions 7f corresponding to comb teeth and a bus bar portion 7b corresponding to a support portion of the comb teeth. The bus bar portion 7b extends in the first direction (X direction) along one side of the semiconductor substrate 11. The finger portions 7f each extend from the bus bar portion 7b in a second direction (Y direction) intersecting the first direction.

Similarly, the second conductivity type region 8 has a so-called comb shape. The second conductivity type region 8 further includes a plurality of finger portions 8f corresponding to comb teeth and a bus bar portion 8b corresponding to a support portion of the comb teeth. The bus bar portion 8b extends in the first direction (X direction) along the other side facing the one side of the semiconductor substrate 11. The finger portion 8f extends from the bus bar portion 8b in the second direction (Y direction).

The finger portions 7f and 8f each have a belt shape extending in the second direction (Y direction) and are alternately provided in the first direction (X direction). It should be noted that the first conductivity type region 7 and the second conductivity type region 8 may be formed in a stripe shape.

Figure 3:
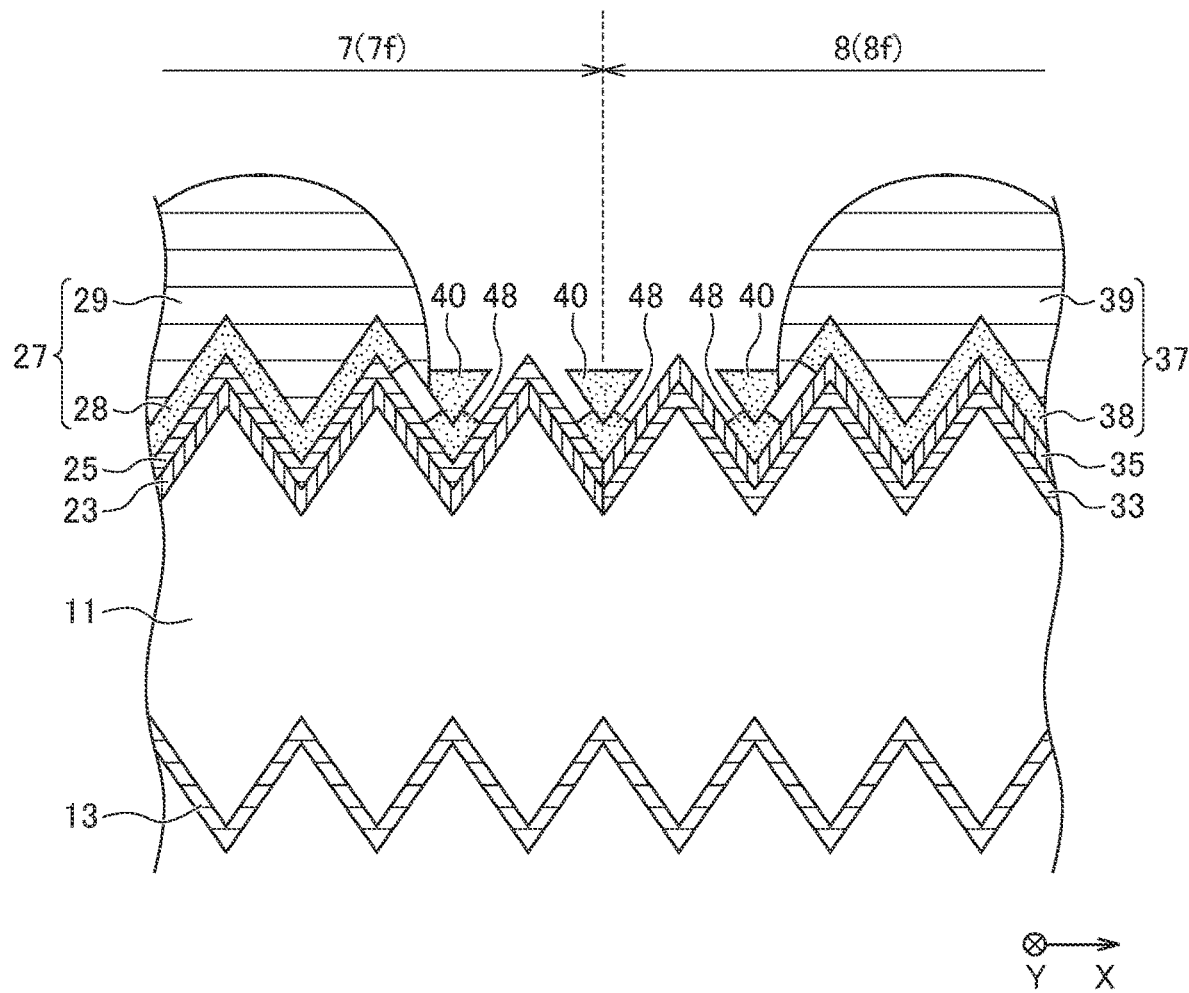
FIG. 3 is a cross-sectional view taken along the line of the solar cell in FIG. 2.

FIG. 3 is a cross-sectional view taken along the line of the solar cell of FIG. 2. As shown in FIG. 3, the solar cell 1 includes a passivation layer 13. The passivation layer 13 is laminated on the light receiving surface of the main surface of the semiconductor substrate 11. The light receiving surface is a main surface of the side to receive light. The solar cell 1 also includes a passivation layer 23, a first conductivity type semiconductor layer 25, and a first electrode layer 27. These three layers are laminated in order on a portion of the back surface of the main surface of the semiconductor substrate 11 (mainly, the first conductivity type region 7). The back surface is the opposite main surface (one main surface) to the light receiving surface. The solar cell 1 also includes a passivation layer 33, a second conductivity type semiconductor layer 35, and a second electrode layer 37. These three layers are laminated in order on one other portion of the back surface of the main surface of the semiconductor substrate 11 (mainly, the second conductivity type region 8).

The semiconductor substrate 11 is made of a crystalline silicon material. The crystalline silicon material includes, for example, crystalline silicon or polycrystalline silicon. The semiconductor substrate 11 is, for example, an n-type semiconductor substrate in which n-type dopant is doped in the crystalline silicon material. It should be noted that the semiconductor substrate 11 may be, for example, a p-type semiconductor substrate in which p-type dopant is doped in the crystalline silicon material. Examples of the n-type dopant include phosphorus (P). Examples of the p-type dopant include boron (B). The semiconductor substrate 11 functions as a photoelectric conversion substrate. The photoelectric conversion substrate absorbs the incident light from the light receiving surface side to generate a photocarrier (electrons and holes).

A crystalline silicon is used as a material of the semiconductor substrate 11. This results in a relatively low dark current. Furthermore, relatively high output can be obtained even when the intensity of the incident light is low (stable output regardless of the illuminance).

The semiconductor substrate 11 may have a fine uneven structure of the pyramid type on the back surface side. This pyramid type fine uneven structure is called a texture structure. Thus, the collection efficiency of light that has passed without being absorbed by the semiconductor substrate 11 is increased.

Furthermore, the semiconductor substrate 11 may have a fine uneven structure of pyramid type on the light receiving surface side. This pyramid type fine uneven structure is called a texture structure. Thus, the reflection of the incident light at the light receiving surface is reduced. Furthermore, the optical confinement effect in the semiconductor substrate 11 is improved.

The passivation layer 13 is disposed on the light receiving surface side of the semiconductor substrate 11. The passivation layer 23 is disposed in the first conductivity type region 7. The first conductivity type region 7 is disposed on the back surface side of the semiconductor substrate 11. A passivation layer 33 is disposed in the second conductivity type region 8. The second conductivity type region 8 is disposed on the back surface side of the semiconductor substrate 11. The passivation layers 13, 23, and 33 are made of, for example, an intrinsic (i-type) amorphous silicon material. The passivation layers 13, 23, and 33 suppress the recombination of carriers generated in the semiconductor substrate 11. This increases the efficiency of carrier recovery.

On the passivation layer 13 of the light receiving surface side of the semiconductor substrate 11, an antireflection layer may be provided. The antireflection layer is made of a material such as SiO, SiN, or SiON.

The first conductivity type semiconductor layer 25 is disposed on the passivation layer 23. That is, the first conductivity type semiconductor layer 25 is disposed in the first conductivity type region 7. The first conductivity type region 7 is disposed on the back surface side of the semiconductor substrate 11. The first conductivity type semiconductor layer 25 is made of, for example, an amorphous silicon material. The first conductivity type semiconductor layer 25 is, for example, a p-type semiconductor layer. In the p-type semiconductor layer, for example, an amorphous silicon material is doped with a p-type dopant (for example, boron (B) described above).

The second conductivity type semiconductor layer 35 is disposed on the passivation layer 33. That is, the second conductivity type semiconductor layer 35 is disposed in the second conductivity type region 8. The second conductivity type semiconductor layer 35 is disposed on the back surface side of the semiconductor substrate 11. The second conductivity type semiconductor layer 35 is made of, for example, an amorphous silicon material. The second conductivity type semiconductor layer 35 is, for example, an n-type semiconductor layer. In the n-type semiconductor layer, for example, an amorphous silicon material is doped with an n-type dopant (for example, phosphorus (P) described above). Incidentally, the first conductivity type semiconductor layer 25 may be an n-type semiconductor layer. Furthermore, the second conductivity type semiconductor layer 35 may be a p-type semiconductor layer.

The first conductivity type semiconductor layer 25 and the passivation layer 23, and the second conductivity type semiconductor layer 35 and the passivation layer 33 each have a strip shape extending in the second direction (Y direction). Furthermore, the first conductivity type semiconductor layer 25 and the passivation layer 23, and the second conductivity type semiconductor layer 35 and the passivation layer 33 are alternately arranged in the first direction (X direction). A portion of each of the second conductivity type semiconductor layer 35 and the passivation layer 33 may overlap a portion of each of the adjacent first conductivity type semiconductor layer 25 and the passivation layer 23 (not shown).

The first electrode layer 27 corresponds to the first conductivity type semiconductor layer 25. Specifically, the first electrode layer 27 is disposed on the first conductivity type semiconductor layer 25. The first conductivity type semiconductor layer 25 is disposed in the first conductivity type region 7. The first conductivity type region 7 is disposed on the back surface side of the semiconductor substrate 11. The second electrode layer 37 corresponds to the second conductivity type semiconductor layer 35. Specifically, the second electrode layer 37 is disposed on the second conductivity type semiconductor layer 35. The second conductivity type semiconductor layer 35 is disposed in the second conductivity type region 8. The second conductivity type region 8 is disposed on the back surface side of the semiconductor substrate 11. The first electrode layer 27 includes a first transparent electrode layer 28 and a first metal electrode layer 29. The first transparent electrode layer 28 and the first metal electrode layer 29 are sequentially stacked on the first conductivity type semiconductor layer 25. The second electrode layer 37 includes a second transparent electrode layer 38 and a second metal electrode layer 39. The second transparent electrode layer 38 and the second metal electrode layer 39 are sequentially stacked on the second conductivity type semiconductor layer 35.

The first transparent electrode layer 28 and the second transparent electrode layer 38 are each made of a transparent conductive material. Examples of the transparent conductive material include ITO (Indium Tin Oxide: a composite oxide of indium oxide and tin oxide) and the like.

The first metal electrode layer 29 and the second metal electrode layer 39 are made of a conductive paste material. The conductive paste material contains, for example, a particulate metal material such as silver, copper, aluminum, or the like, an insulating resin material, and a solvent.

The first electrode layer 27 and the second electrode layer 37 refer to the first transparent electrode layer 28, the second transparent electrode layer 38, the first metal electrode layer 29, and the second metal electrode layer 39. The first transparent electrode layer 28, the second transparent electrode layer 38, the first metal electrode layer 29, and the second metal electrode layer 39 each have a strip shape extending in the second direction (Y direction). Furthermore, the first transparent electrode layer 28, the second transparent electrode layer 38, the first metal electrode layer 29, and the second metal electrode layer 39 are alternately arranged in the first direction (X direction). The first transparent electrode layer 28 and the second transparent electrode layer 38 are separated from each other. Furthermore, the first metal electrode layer 29 and the second metal electrode layer 39 are separated from each other.

The band width in the first direction (X direction) of the first transparent electrode layer 28 is narrower than the band width in the first direction (X direction) of the first metal electrode layer 29. The band width in the first direction (X direction) of the second transparent electrode layer 38 is narrower than the band width in the first direction (X direction) of the second metal electrode layer 39.

A resin film 40 is provided on the periphery of the first metal electrode layer 29 and the periphery of the second metal electrode layer 39. The resin film 40 is formed by unevenly distributing the insulating resin material in the conductive paste material in the first metal electrode layer 29 and the second metal electrode layer 39.

A portion of the first conductivity type semiconductor layer 25 is disposed between the first metal electrode layer 29 and the second metal electrode layer 39. A portion of the second conductivity type semiconductor layer 35 is disposed between the first metal electrode layer 29 and the second metal electrode layer 39. Each of these portions is covered with the resin film 40. In detail, the valley portion of the uneven structure (texture structure) of the first conductivity type semiconductor layer 25 is disposed between the first metal electrode layer 29 and the second metal electrode layer 39. The valley portion of the uneven structure of the second conductivity type semiconductor layer 35 is disposed between the first metal electrode layer 29 and the second metal electrode layer 39. Each of these valley portions is covered with the resin film 40. On the other hand, the top portion of the uneven structure of the first conductivity type semiconductor layer 25 is disposed between the first metal electrode layer 29 and the second metal electrode layer 39. The top portion of the uneven structure of the second conductivity type semiconductor layer 35 is disposed between the first metal electrode layer 29 and the second metal electrode layer 39. These top portions are not covered with the resin film 40, and are exposed.

Between the first conductivity type semiconductor layer 25 and the resin film 40, a transparent conductive film 48 is arranged in an island-like shape (discontinuous). Between the second conductivity type semiconductor layer 35 and the resin film 40, a transparent conductive film 48 is arranged in an island-like shape (discontinuous). The transparent conductive films 48 are made of, for example, the same material as the first transparent electrode layer 28 and the second transparent electrode layer 38. In detail, between the valley portion of the uneven structure of the first conductivity type semiconductor layer 25 and the resin film 40, the transparent conductive film 48 is disposed in an island-like shape. Between the valley portion of the uneven structure of the second conductivity type semiconductor layer 35 and the resin film 40, the transparent conductive film 48 is disposed in an island-like shape.

The contact area between the first metal electrode layer 29 and the first conductivity type semiconductor layer 25 is equal to or less than half the contact area between the first transparent electrode layer 28 and the first conductivity type semiconductor layer 25. The contact area between the second metal electrode layer 39 and the second conductivity type semiconductor layer 35 is equal to or less than half the contact area between the second transparent electrode layer 38 and the second conductivity type semiconductor layer 35.

Hereinafter, a method of manufacturing the solar cell will be described. In order to facilitate understanding of the features of the method of manufacturing the solar cell according to the present embodiment, before explaining the method of manufacturing the solar cell of the present embodiment, a method of manufacturing the solar cell which was considered in the course of the inventors of the present application devising the method of manufacturing the solar cell of the present embodiment will be described as a comparative example.

Method of Manufacturing Solar Cell According to Comparative Example

Figure 6A:
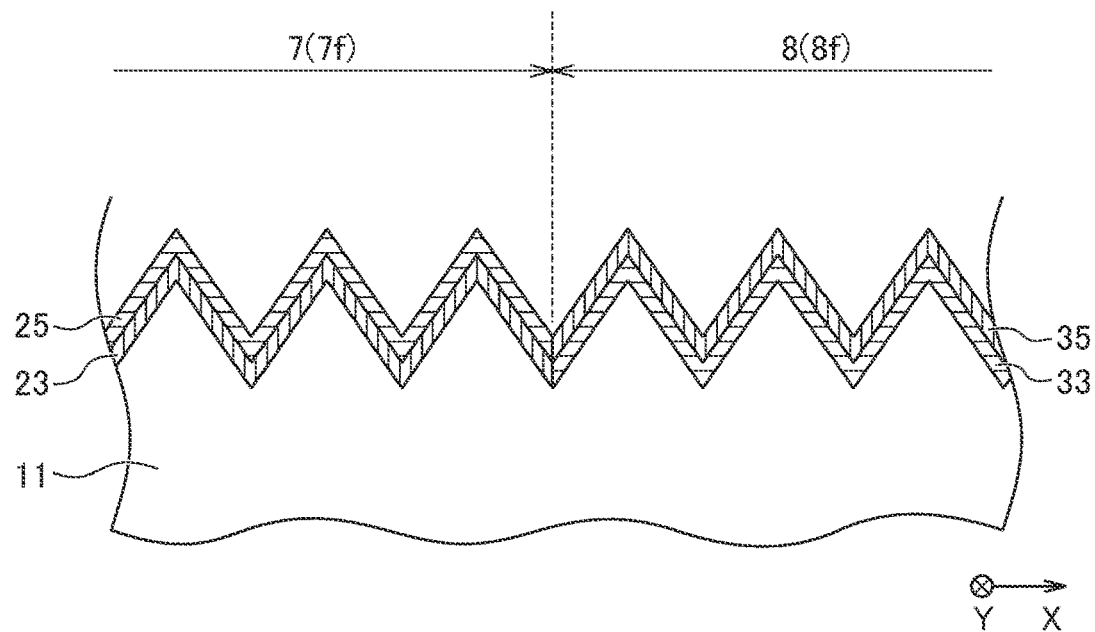
FIG. 6A is a view showing a semiconductor layer forming step in the method of manufacturing a solar cell according to a comparative example.
Figure 6B:
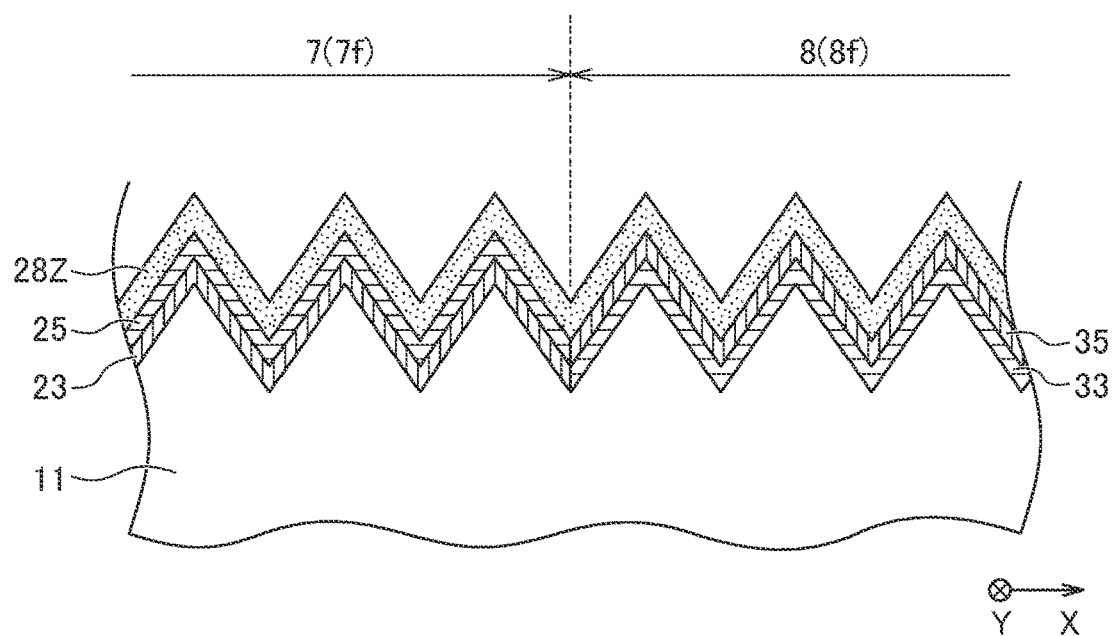
FIG. 6B is a view showing a transparent conductive film forming step in the method of manufacturing the solar cell according to the comparative example.
Figure 6C:
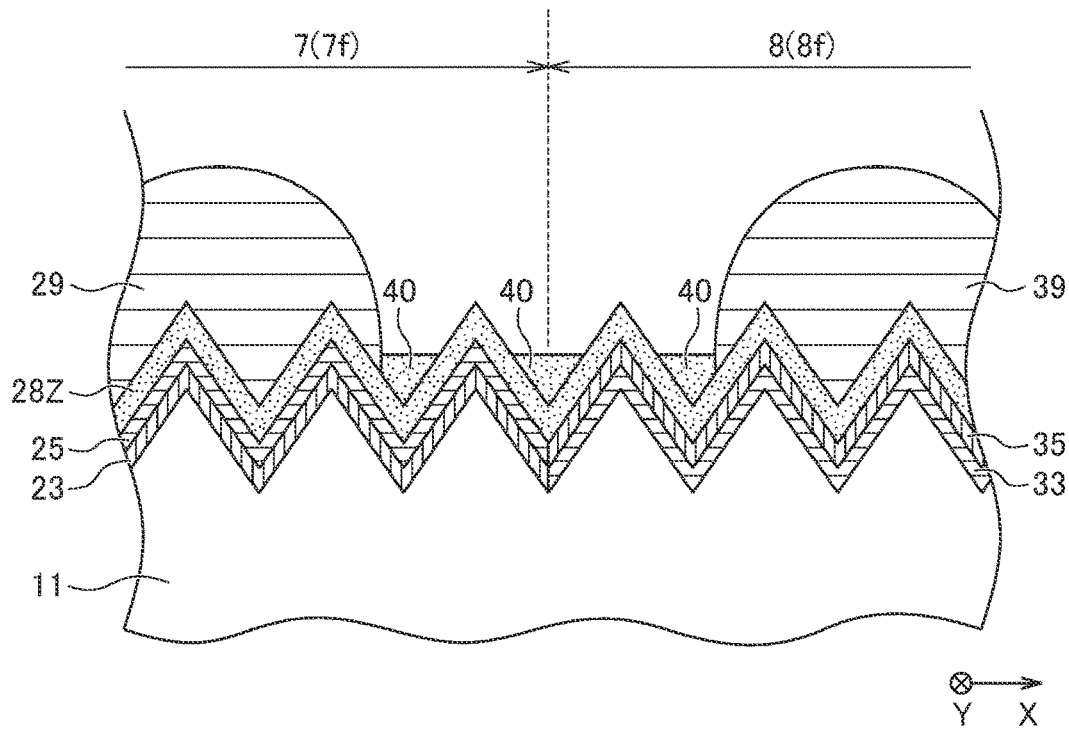
FIG. 6C is a view showing a metal electrode layer forming step in the method of manufacturing the solar cell according to the comparative example.
Figure 6D:
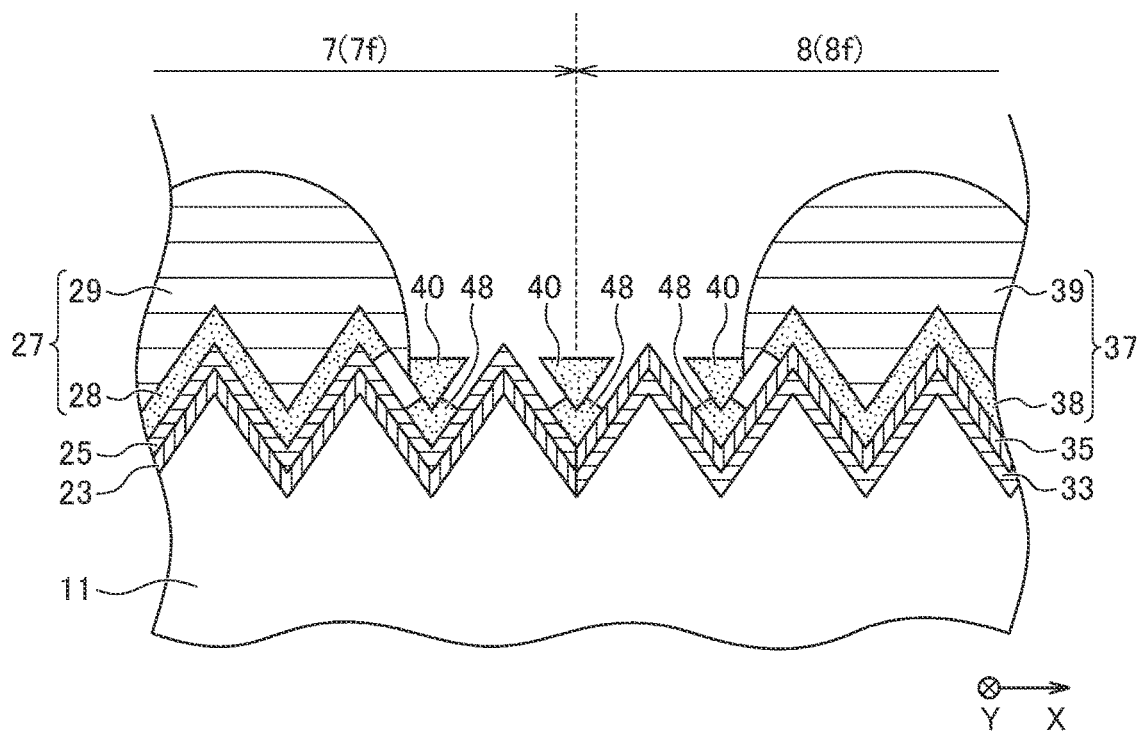
FIG. 6D is a view showing a transparent electrode layer forming step in the method of manufacturing the solar cell according to the comparative example.

Referring to FIGS. 6A to 6D, a method of manufacturing a solar cell according to a comparative example will be described. FIG. 6A is a view showing a semiconductor layer forming step in a method of manufacturing a solar cell according to a comparative example. FIG. 6B is a view showing a transparent conductive layer forming step in the method of manufacturing the solar cell according to the comparative example. FIG. 6C is a view showing a metal electrode layer forming step in the method of manufacturing the solar cell according to the comparative example. FIG. 6D is a view showing a transparent electrode layer forming step in the method of manufacturing the solar cell according to the comparative example. FIG. 6A to FIG. 6D each show the back surface side of the semiconductor substrate 11, and omit the front surface side of the semiconductor substrate 11.

First, as shown in FIG. 6A, the passivation layer 23 and the first conductivity type semiconductor layer 25 are formed on a portion of the back surface side of the semiconductor substrate 11 (the semiconductor layer forming step). The portion of the back surface side of the semiconductor substrate 11 has an uneven structure (texture structure) at least on the back surface side. Furthermore, a portion of the back surface side of the semiconductor substrate 11 is specifically the first conductivity type region 7.

The following steps may be performed. First, for example, the passivation film and the first conductivity type semiconductor film are formed on all of the back surface side of the semiconductor substrate 11 using a CVD method or PVD method. After this step, the passivation layer 23 and the first conductivity type semiconductor layer 25 are patterned using an etching method utilizing a mask or metal mask generated using a photolithography technique. In addition, examples of the etching solution for the p-type semiconductor film include an acidic solution such as of hydrofluoric acid containing ozone or a mixed solution of nitric acid and hydrofluoric acid. Examples of the etching solution for the n-type semiconductor film include an alkaline solution such as an aqueous potassium hydroxide solution.

Alternatively, the following steps may be performed simultaneously. The passivation layer and the first conductivity type semiconductor layer are laminated on the back surface side of the semiconductor substrate 11 using a CVD method or PVD method. At the same time, the passivation layer 23 and the p-type semiconductor layer 25 are formed and patterned using a mask.

Next, the passivation layer 33 and the second conductivity type semiconductor layer 35 are formed on the other portion of the back surface side of the semiconductor substrate 11 (the semiconductor layer forming step). The other portion of the back surface side of the semiconductor substrate 11 is specifically the second conductivity type region 8.

For example, as described above, the following steps may be performed. First, the passivation film and the second conductivity type semiconductor film are formed on all of the back surface side of the semiconductor substrate 11 using a CVD method or PVD method. After this step, the passivation layer 33 and the second conductivity type semiconductor layer 35 are patterned using an etching method utilizing a mask or metal mask generated using a photolithography technique.

Alternatively, the following steps may be performed simultaneously. The passivation layer and the second conductivity type semiconductor layer are laminated on the back surface side of the semiconductor substrate 11 using a CVD method or PVD method. At the same time, the passivation layer 33 and the second conductivity type semiconductor layer 35 are formed and patterned using a mask.

It should be noted that, in the semiconductor layer forming step, the passivation layer 13 may be formed on the entire surface of the light receiving surface side of the semiconductor substrate 11 (not shown).

Next, as shown in FIG. 6B, a transparent conductive film 28Z is formed on and across the first conductivity type semiconductor layer 25 and the second conductivity type semiconductor layer 35 such that the transparent conductive film 28Z straddles them (transparent conductive film forming step). As the method of forming the transparent conductive film 28Z, for example, a CVD method, a PVD method, or the like is used.

Next, as shown in FIG. 6C, the first metal electrode layer 29 is formed on the first conductivity type semiconductor layer 25 with the transparent conductive film 28Z interposed therebetween. Then, the second metal electrode layer 39 is formed on the second conductivity type semiconductor layer 35 with the transparent conductive film 28Z interposed therebetween (metal electrode layer forming step).

The first metal electrode layer 29 and the second metal electrode layer 39 are formed by printing them with a printing material such as ink. Examples of the method of forming the first metal electrode layer 29 and the second metal electrode layer 39 include a screen printing method, an inkjet method, a gravure coating method, and a dispenser method. Among these methods, the screen printing method is preferred.

The printing material includes a particulate (e.g., spherical) metal material in an insulating resin material. The printing material may include a solvent or the like for adjustment of viscosity or coatability.

Examples of the insulating resin material include a matrix resin. In detail, the insulating resin is preferably a polymer compound, and particularly preferably a thermosetting resin or an ultraviolet curable resin. Examples thereof include an epoxy, a urethane, a polyester, or a silicone-based resin.

Examples of the metal material include silver, copper, and aluminum. Among these, a silver paste containing silver particles is preferred.

For example, the ratio of the metal material contained in the printing material is 85% or more and 95% or less (i.e., from 85% to 95%) as a weight ratio relative to the entire printing material.

Next, after printing of the first metal electrode layer 29 and the second metal electrode layer 39, the insulating resin in the first metal electrode layer 29 and the second metal electrode layer 39 is cured by heat treatment or ultraviolet irradiation treatment (e.g., 180 degrees, 60 minutes). At this time, the insulating resin material seeps out to the periphery of the first metal electrode layer 29 and the second metal electrode layer 39. In this manner, the resin film 40 is formed on the periphery of the first metal electrode layer 29 and the periphery of the second metal electrode layer 39. The resin film 40 is formed by unevenly distributing an insulating resin material.

At this time, the valley portions of the uneven structure (texture structure) of the transparent conductive film 28Z are covered with the resin film 40. The valley portions are disposed between the first metal electrode layer 29 and the second metal electrode layer 39. The top portions of the uneven structure of the transparent conductive film 28Z are not covered with the resin film 40 and are exposed. The top portions are disposed between the first metal electrode layer 29 and the second metal electrode layer 39.

The first metal electrode layer 29 and the second metal electrode layer 39 formed of the conductive paste may have urethane bonds. For example, as compared with an epoxy resin, a urethane resin has small shrinkage at the time of crosslinking, and cracks hardly occur in the resin. Since cracks are less likely to occur in the resin, the etching solution can be prevented from infiltrating into the metal electrode layer. Thus, peeling of the metal electrode layer caused by the transparent conductive film under the metal electrode layer being etched or deterioration of long-term reliability can be prevented.

Next, as shown in FIG. 6D, the transparent conductive film 28Z is patterned by an etching method using the first metal electrode layer 29 and the resin film 40 at the periphery thereof, and the second metal electrode layer 39 and the resin film 40 at the periphery thereof as masks. Thus, the first transparent electrode layer 28 and the second transparent electrode layer 38 separated from each other are formed (transparent electrode layer forming step). Examples of the etching method include a wet etching method. Examples of the etching solution include an acidic solution such as of hydrochloric acid (HCl).

At this time, between the first metal electrode layer 29 and the second metal electrode layer 39, the etching of the transparent conductive film 28Z progresses from the top portion toward the valley portion of the uneven structure (texture structure). Here, in order to separate the first transparent electrode layer 28 and the second transparent electrode layer 38, the transparent conductive film between them need not be continuous. Therefore, the transparent conductive film 48 may remain in an island-like shape at the valley portion of the uneven structure. When the transparent conductive film 48 remains in an island-like shape at the valley portion of the uneven structure, the resin film 40 at the valley portion of the uneven structure remains on the first conductivity type semiconductor layer 25 and the second conductivity type semiconductor layer 35. Through the above steps, the back electrode type solar cell 1 of the comparative example is obtained.

Here, the conventional method of manufacturing a solar cell includes the transparent electrode layer forming step after the transparent conductive film forming step and before the metal electrode layer forming step. In the transparent electrode layer forming step, a transparent conductive film is patterned using, for example, a photolithography method. Thus, the first transparent electrode layer and the second transparent electrode layer separated from each other are formed. In the photolithography method,
  a resist is applied over the transparent conductive film,
  by exposing the resist to light, openings are formed in the resist,
  the first transparent electrode layer and the second transparent electrode layer separated from each other are formed by etching the transparent conductive film exposed at the openings using the resist as a mask, and
  the resist is removed.

On the other hand, the method of manufacturing the solar cell of the comparative example includes a metal electrode layer forming step and a transparent electrode layer forming step in this order after the transparent conductive film forming step. In the transparent electrode layer forming step, the transparent conductive film 28Z is patterned using the first metal electrode layer 29 and the second metal electrode layer 39 formed in the metal electrode layer forming step as masks. Thus, the first transparent electrode layer 28 and the second transparent electrode layer 38 separated from each other are formed. Thus, according to the method of manufacturing the solar cell of the comparative example, it is unnecessary to use a photolithography method using a mask or the like as in the conventional method. Therefore, it is possible to simplify and shorten the formation of the transparent electrode layer. As a result, it is possible to reduce the cost of the solar cell and the solar cell module.

Here, when the transparent conductive film 28Z is patterned using the first metal electrode layer 29 and the second metal electrode layer 39 as masks, the transparent conductive film 28Z below the first metal electrode layer 29 and the second metal electrode layer 39 is also etched during etching of the transparent conductive film 28Z. As a result, there is a possibility that the first transparent electrode layer 28 and the first metal electrode layer 29, and the second transparent electrode layer 38 and the second metal electrode layer 39 are peeled off.

In this regard, according to the method of manufacturing a solar cell of the comparative example, in the metal electrode layer forming step, a printing material containing a particulate metal material, a resin material, and a solvent is printed and allowed to cure, whereby the resin film 40 is formed on the periphery of the first metal electrode layer 29 and the periphery of the second metal electrode layer 39. This resin film 40 is made by unevenly distributed resin material. Further, in the transparent electrode layer forming step, the transparent conductive film 28Z is patterned using the first metal electrode layer 29 and the resin film 40 at the periphery thereof, and the second metal electrode layer 39 and the resin film 40 at the periphery thereof as masks. Thus, etching of the transparent conductive film 28Z below the first metal electrode layer 29 and the second metal electrode layer 39 is suppressed. As a result, peeling of the first transparent electrode layer 28 and the first metal electrode layer 29 and peeling of the second transparent electrode layer 38 and the second metal electrode layer 39 are suppressed.

In the solar cell 1 manufactured by such a manufacturing method, the band width of the first transparent electrode layer 28 is narrower than the band width of the first metal electrode layer 29. The band width of the second transparent electrode layer 38 is narrower than the band width of the second metal electrode layer 39. Further, a resin film is formed on the periphery of the first metal electrode layer 29 and the periphery of the second metal electrode layer 39. This resin film is made by the resin material in the printing material of the first metal electrode layer 29 and the second metal electrode layer 39 is unevenly distributed. It should be noted that, in a solar cell manufactured by a conventional method of manufacturing a solar cell, generally, the band width of the transparent electrode layer is wider than the band width of the metal electrode layer.

In the solar cell 1 manufactured by the manufacturing method of the comparative example, a portion of the first conductivity type semiconductor layer 25 and a portion of the second conductivity type semiconductor layer 35 are covered with the resin film 40. A portion of the first conductivity type semiconductor layer 25 and a portion of the second conductivity type semiconductor layer 35 are disposed between the first metal electrode layer 29 and the second metal electrode layer 39. In detail, the valley portions of the uneven structure (texture structure) of the first conductivity type semiconductor layer 25 and the valley portions of the uneven structure of the second conductivity type semiconductor layer 35 are covered with the resin film 40. These valley portions are arranged between the first metal electrode layer 29 and the second metal electrode layer 39.

Further, between the first conductivity type semiconductor layer 25 and the resin film 40, the transparent conductive film 48 is disposed (discontinuous) in an island-like shape. Between the second conductivity type semiconductor layer 35 and the resin film 40, the transparent conductive film 48 is arranged in island-like shape (discontinuous). The transparent conductive film 48 is made of, for example, the same material as the first transparent electrode layer 28 and the second transparent electrode layer 38. In detail, between the valley portions of the uneven structure of the first conductivity type semiconductor layer 25 and the resin film 40, the transparent conductive film 48 is disposed in an island-like shape. Between the valley portions of the uneven structure of the second conductivity type semiconductor layer 35 and the resin film 40, the transparent conductive film 48 is disposed in an island-like shape. Thus, the area where the first conductivity type semiconductor layer 25 and the second conductivity type semiconductor layer 35 are exposed is reduced. Therefore, deterioration of the solar cell and the solar cell module is suppressed. This improves the reliability (e.g., long-term durability) of the solar cell and the solar cell module.

As described above, according to the method of manufacturing the solar cell of the comparative example, it is possible to simplify and shorten the formation of the transparent electrode layer as compared with a method using a conventional photolithography method or the like. However, the performance of the solar cell deteriorates. This is presumed to be due to the following reasons.

Figure 7:
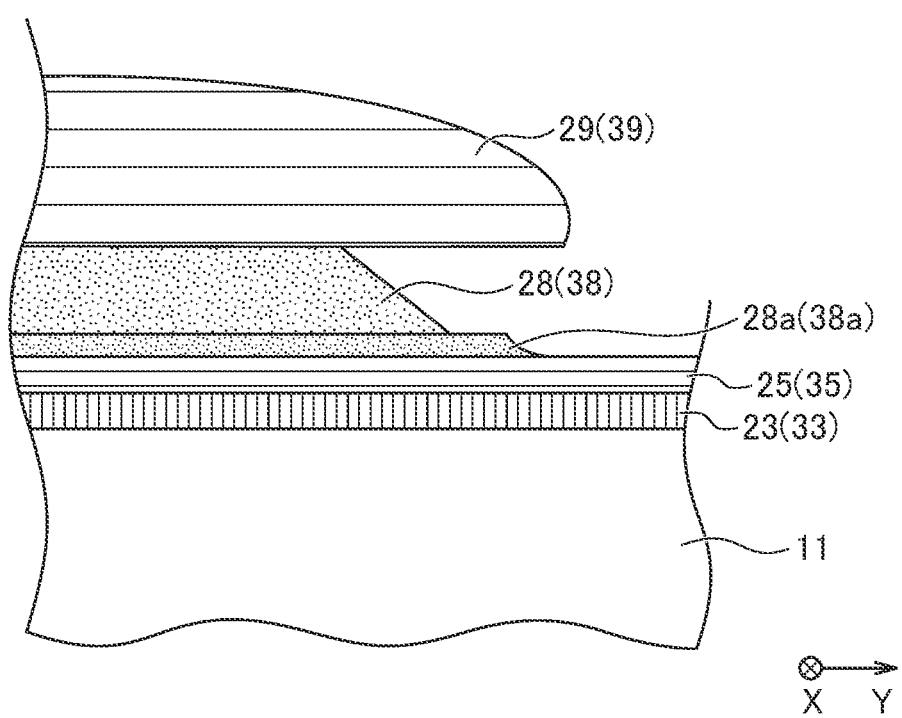
FIG. 7 is a diagram showing enlarged end portions of the transparent electrode layer and the metal electrode layer in the solar cell according to the comparative example.

According to the findings of the inventors of the present application, as shown in FIG. 7, in the transparent electrode layer 28 (38), a portion 28a (38a) of the interface with the semiconductor substrate 11 may be hardly melted as compared with other portions. It is presumed that this is because the semiconductor layers 25, 23 (35, 33) underlying the transparent electrode layer 28 (38) are amorphous silicon layers, so that the portion 28a (38a) of the interface with the semiconductor substrate 11 is crystallized and hardly melted.

In the condition of hydrochloric acid immersion necessary to etch the portion 28a (38a) of the interface between the semiconductor substrate 11, the ends of the other portions tend to be etched more than necessary (side etching). As a result, it is presumed that the contact area between the transparent electrode layer 28 (38) and the metal electrode layer 29 (39) decreases. Therefore, the performance of the solar cell deteriorates.

In the method of manufacturing the solar cell of the comparative example,
the metal electrode layers 29 and 39 are fired (180 degrees, 60 minutes) (the metal electrode layer forming step),
then, the transparent conductive film 28Z is etched using the metal electrode layers 29 and 39 as masks (the transparent electrode layer forming step).

Method of Manufacturing Solar Cell of the Present Embodiment

In contrast, in the method of manufacturing a solar cell of the present embodiment,
the uncured films 29Z and 39Z of the metal electrode layer are dried (e.g., 150 degrees, 3 minutes) (metal electrode layer uncured film forming step),
using the uncured films 29Z and 39Z of the metal electrode layer as masks, the transparent conductive film 28Z is etched (transparent electrode layer forming step),
then, the metal electrode layers 29 and 39 are fired (180 degrees, 60 minutes) (metal electrode layer forming step).

Figure 4A:
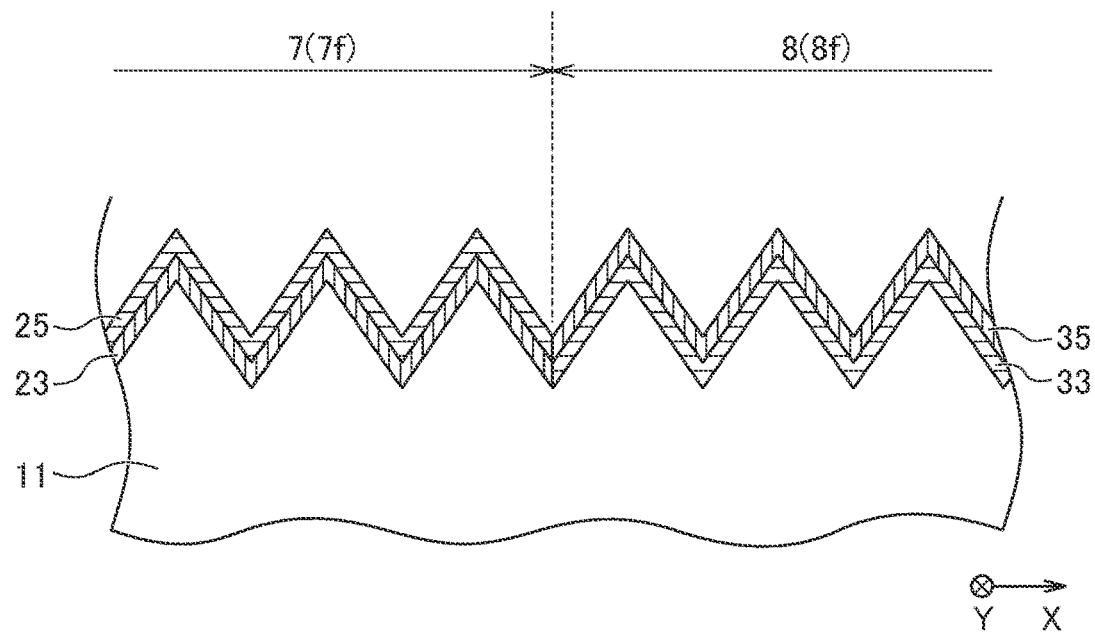
FIG. 4A is a view showing a semiconductor layer forming step in a method of manufacturing the solar cell according to the present embodiment.
Figure 4B:
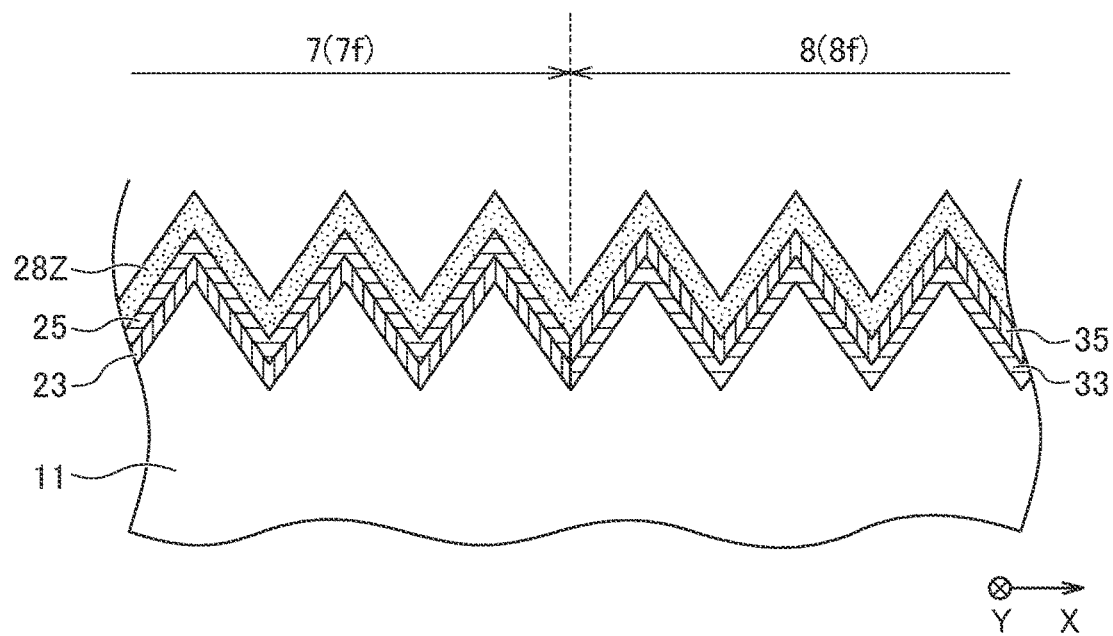
FIG. 4B is a view showing a transparent conductive film forming step in the method of manufacturing the solar cell according to the present embodiment.
Figure 4C:
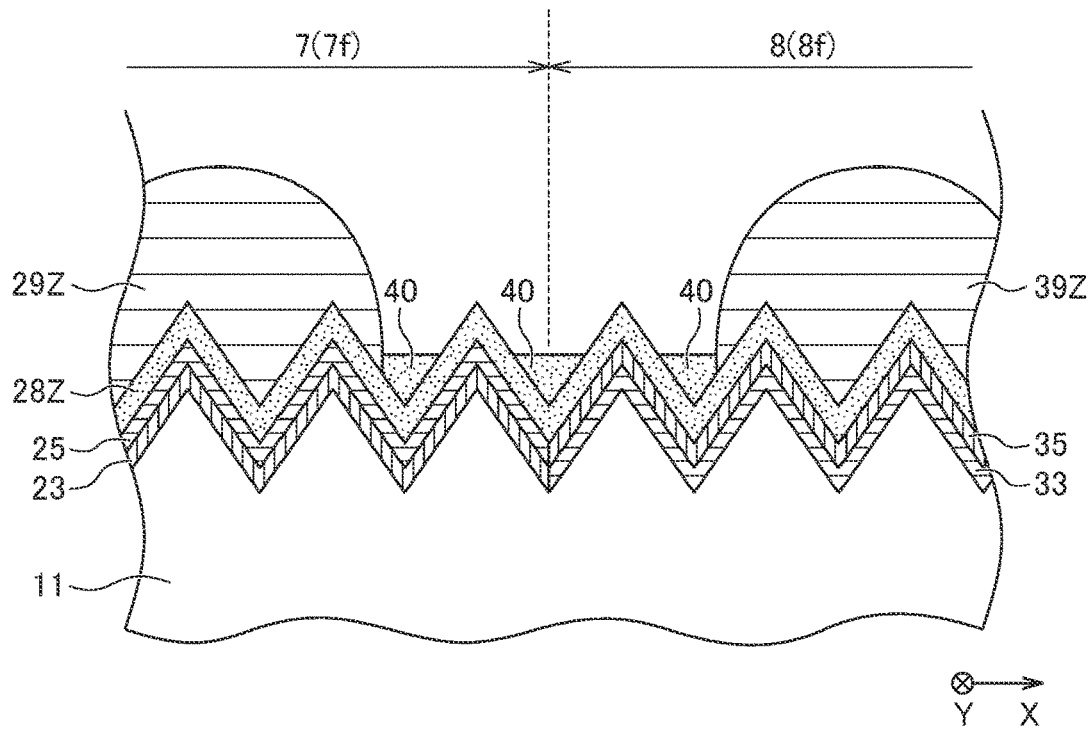
FIG. 4C is a view showing a metal electrode layer uncured film forming step in the method of manufacturing the solar cell according to the present embodiment.
Figure 4D:
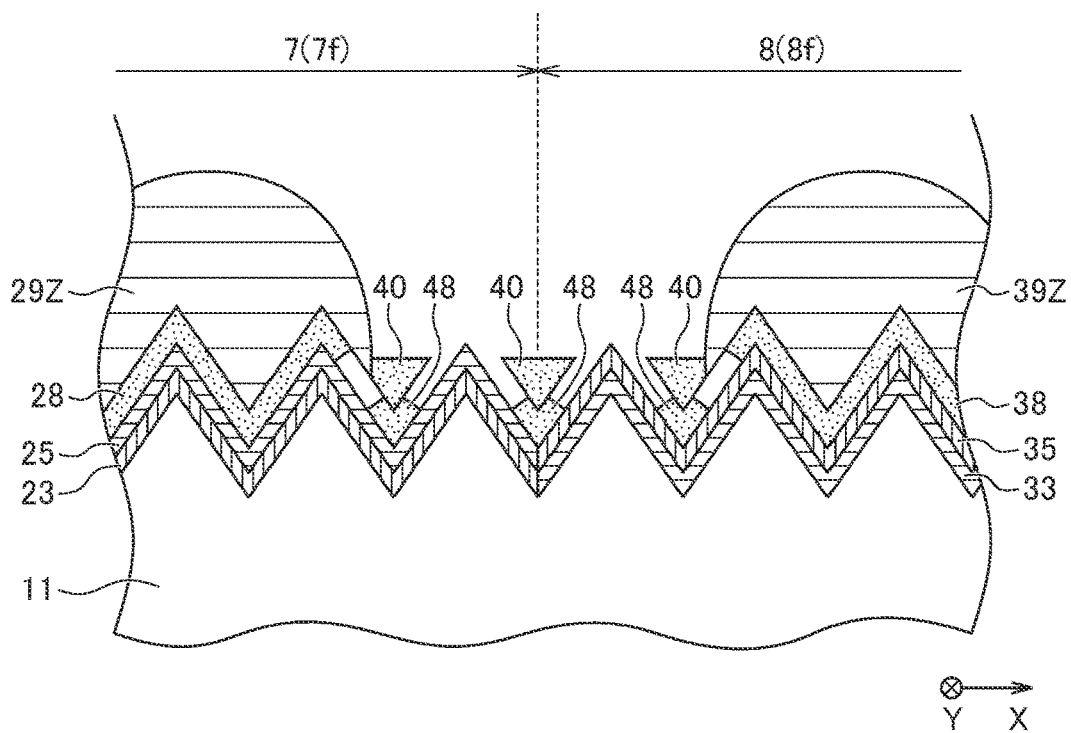
FIG. 4D is a view showing a transparent electrode layer forming step in the method of manufacturing the solar cell according to the present embodiment.
Figure 4E:
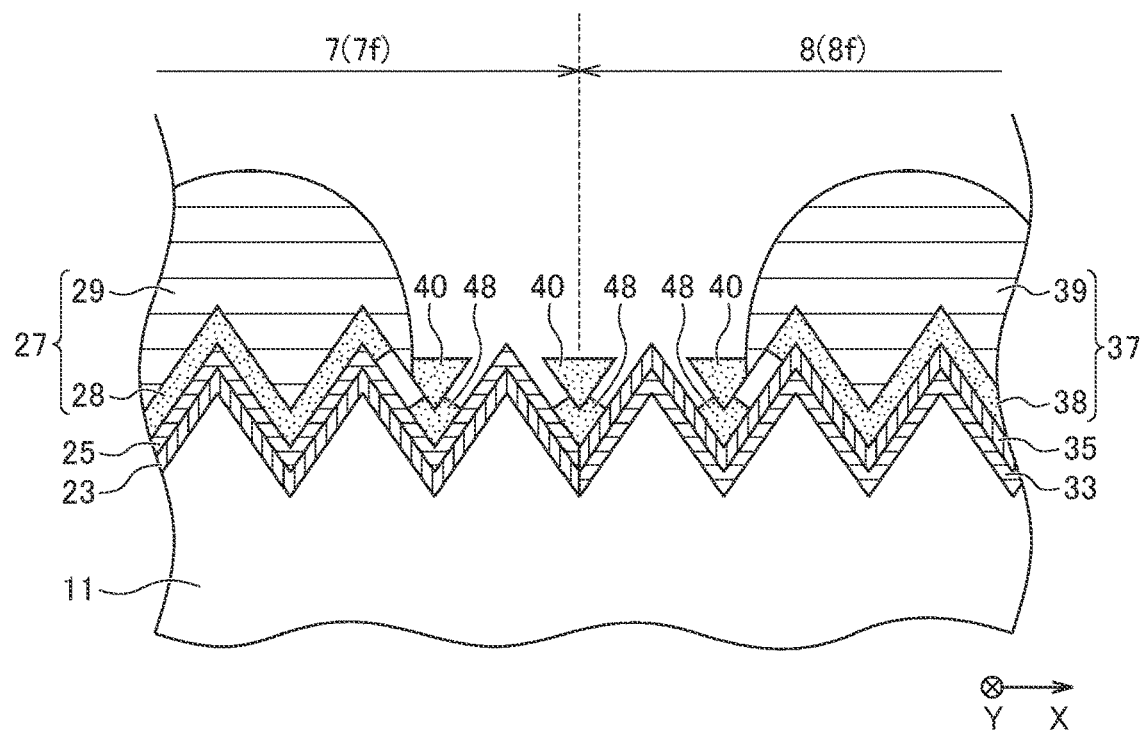
FIG. 4E is a view showing a metal electrode layer forming step in the method of manufacturing the solar cell according to the present embodiment.

Hereinafter, referring to FIGS. 4A to 4E, the method of manufacturing a solar cell according to the present embodiment will be described. FIG. 4A is a view showing a semiconductor layer forming step in the method of manufacturing the solar cell according to the present embodiment. FIG. 4B is a view showing a transparent conductive layer forming step in the method of manufacturing the solar cell according to the present embodiment. FIG. 4C is a view showing a metal electrode layer uncured film forming step in the method of manufacturing the solar cell according to the present embodiment. FIG. 4D is a view showing a transparent electrode layer forming step in the method of manufacturing the solar cell method according to the present embodiment. FIG. 4E is a view showing a metal electrode layer forming step in the method of manufacturing the solar cell according to the present embodiment. FIGS. 4A to 4E each show the back surface side of the semiconductor substrate 11, and omit the front surface side of the semiconductor substrate 11.

First, similarly to the comparative example, as shown in FIG. 4A, the passivation layer 23 and the first conductivity type semiconductor layer 25 are formed on a portion of the back surface side of the semiconductor substrate 11 (semiconductor layer forming step). The portion of the back surface side of the semiconductor substrate 11 has an uneven structure (texture structure) at least on the back surface. Further, the portion of the back surface side of the semiconductor substrate 11 is specifically the first conductivity type region 7.

The following steps may be performed. First, for example, similarly to the above, the passivation film and the first conductivity type semiconductor film are formed on all of the back surface side of the semiconductor substrate 11 using a CVD method or PVD method. After that step, the passivation layer 23 and the first conductivity type semiconductor layer 25 are patterned using an etching method utilizing a mask or metal mask generated using a photolithography technique.

Alternatively, the following steps may be performed simultaneously. The passivation layer and the first conductivity type semiconductor layer are laminated on the back surface side of the semiconductor substrate 11 using a CVD method or PVD method. At the same time, the passivation layer 23 and the p-type semiconductor layer 25 are formed and patterned using a mask.

Next, the passivation layer 33 and the second conductivity type semiconductor layer 35 are formed on the other portion of the back surface side of the semiconductor substrate 11 (the semiconductor layer forming step). The other portion of the back surface side of the semiconductor substrate 11 is specifically the second conductivity type region 8.

For example, as described above, the following steps may be performed. First, the passivation film and the second conductivity type semiconductor film are formed on all of the back surface side of the semiconductor substrate 11 using a CVD method or PVD method. After that step, the passivation layer 33 and the second conductivity type semiconductor layer 35 are patterned using an etching method utilizing a mask or metal mask generated using a photolithography technique.

Alternatively, the following steps may be performed simultaneously. The passivation layer and the second conductivity type semiconductor layer are formed on the back surface side of the semiconductor substrate 11 using a CVD method or PVD method. At the same time, the passivation layer 33 and the second conductivity type semiconductor layer 35 are formed and patterned using a mask.

In this semiconductor layer forming step, the passivation layer 13 (not shown) may be formed on the entire surface of the light receiving surface side of the semiconductor substrate 11.

Next, similarly to the comparative example, as shown in FIG. 4B, the transparent conductive film 28Z is formed on and across the first conductivity type semiconductor layer 25 and the second conductivity type semiconductor layer 35 such that the transparent conductive film 28Z straddles them (transparent conductive film forming step). As a method of forming the transparent conductive film 28Z, for example, a CVD method, a PVD method, or the like is used.

Next, as shown in FIG. 4C, the uncured film 29Z of the first metal electrode layer is formed on the first conductivity type semiconductor layer 25 with the transparent conductive film 28Z interposed therebetween. Then, the uncured film 39Z of the second metal electrode layer is formed on the second conductivity type semiconductor layer 35 with the transparent conductive film 28Z interposed therebetween (metal electrode layer uncured film forming step).

The uncured film 29Z of the first metal electrode layer and the uncured film 39Z of the second metal electrode layer are formed by printing with a printing material (e.g., ink) in the same manner as described above. As a method of forming the uncured film 29Z of the first metal electrode layer and the uncured film 39Z of the second metal electrode layer, a screen print method, an ink jet method, a gravure coating method, a dispenser method, or the like can be used. Among these methods, the screen printing method is preferable.

As described above, the printing material includes a particulate (e.g., spherical) metal material in an insulating resin material. The printing material may include a solvent or the like for adjustment of viscosity or coatability.

Examples of the insulating resin material include a matrix resin. In detail, the insulating resin is preferably a polymer compound, and particularly preferably a thermosetting resin or an ultraviolet curable resin. Examples thereof include an epoxy, a urethane, a polyester, or a silicone-based resin.

Examples of the metal material include silver, copper, and aluminum. Among these, a silver paste containing silver particles is preferred.

For example, the ratio of the metal material contained in the printing material is 85% or more and 95% or less (i.e., from 85% to 95%) as a weight ratio relative to the entire printing material.

Next, after the uncured film 29Z of the first metal electrode layer and the uncured film 39Z of the second metal electrode layer are printed, the insulating resin in the uncured film 29Z of the first metal electrode layer and the uncured film 39Z of the second metal electrode layer are dried by heat treatment or ultraviolet irradiation treatment. As the drying conditions, the heating temperature is set lower and the heating time is set shorter as compared with the firing conditions described later. For example, the drying conditions are a heating temperature of 120 degrees or more and 180 degrees or less (i.e., from 120 to 180 degrees) and a heating time of 1 minute or more and 20 minutes or less (i.e., from 1 minute to 20 minutes), and preferably a heating temperature of 150 degrees and a heating time of 3 minutes. Thus, in the uncured film 29Z of the first metal electrode layer and the uncured film 39Z of the second metal electrode layer, the insulating resin at the surface dries, but the insulating resin inside remains in a non-dried state.

At this time, similarly to the comparative example, the insulating resin material seeps out to the periphery of the uncured film 29Z of the first metal electrode layer and the uncured film 39Z of the second metal electrode layer. In this manner, the resin film 40 is formed on the periphery of the uncured film 29Z of the first metal electrode layer and the periphery of the uncured film 39Z of the second metal electrode layer. The resin film 40 is formed by unevenly distributing an insulating resin material.

Furthermore, at this time, similarly to the comparative example, the valley portions of the uneven structure (texture structure) of the transparent conductive film 28Z are covered with the resin film 40. The valley portions are disposed between the uncured film 29Z of the first metal electrode layer and the uncured film 39Z of the second metal electrode layer. The top portions of the uneven structure of the transparent conductive film 28Z are not covered with the resin film 40 and are exposed. The top portions are disposed between the uncured film 29Z of the first metal electrode layer and the uncured film 39Z of the second metal electrode layer.

Similarly to the comparative example, the uncured film 29Z of the first metal electrode layer and the uncured film 39Z of the second metal electrode layer made of the conductive paste may have urethane bonds.

Next, as shown in FIG. 4D, the transparent conductive film 28Z is patterned by an etching method using the uncured film 29Z of the first metal electrode layer and the resin film 40 at the periphery thereof, and the uncured film 39Z of the second metal electrode layer and the resin film 40 at the periphery thereof as masks. Thus, the first transparent electrode layer 28 and the second transparent electrode layer 38 separated from each other are formed (transparent electrode layer forming step). Examples of the etching method include a wet etching method. Examples of the etching solution include an acidic solution such as of hydrochloric acid (HCl).

At this time, similarly to the comparative example, between the uncured film 29Z of the first metal electrode layer and the uncured film 39Z of the second metal electrode layer, etching of the transparent conductive film 28Z progresses from the top portion of the uneven structure (texture structure) toward the valley portions. Here, in order to separate the first transparent electrode layer 28 and the second transparent electrode layer 38 from each other, the transparent conductive film between them need not be continuous. Therefore, the transparent conductive film 48 may remain in an island-like shape at the valley portion of the uneven structure. When the transparent conductive film 48 remains in an island-like shape at the valley portion of the uneven structure, the resin film 40 at the valley portion of the uneven structure remains on the first conductivity type semiconductor layer 25 and the second conductivity type semiconductor layer 35.

Next, as shown in FIG. 4E, the uncured film 29Z of the first metal electrode layer and the uncured film 39Z of the second metal electrode layer are fired and cured. As a result, the first metal electrode layer 29 and the second metal electrode layer 39 are formed (metal electrode layer forming step). Examples of the firing treatment include a heat treatment or an ultraviolet irradiation treatment as in the above-described drying treatment. The firing conditions are, for example, a heating temperature of 160 degrees or more and 200 degrees or less (i.e., from 160 degrees to 200 degrees), and a heating time of 30 minutes or more and 120 minutes or less (i.e., from 30 minutes to 120 minutes), and preferably a heating temperature of 180 degrees and a heating time of 60 minutes. Thus, in the first metal electrode layer 29 and the second metal electrode layer 39, it is possible to cure the insulating resin on the surface and the inside.

At this time, the insulating resin material further seeps out to the periphery of the first metal electrode layer 29 and the second metal electrode layer 39. In this manner, the resin film 40 is further formed on the periphery of the first metal electrode layer 29 and the periphery of the second metal electrode layer 39. The resin film 40 is formed by unevenly distributing an insulating resin material.

At this time, similarly to the comparative example, the valley portions of the uneven structure (texture structure) of the transparent conductive film 28Z are covered with the resin film 40. The valley portions are disposed between the first metal electrode layer 29 and the second metal electrode layer 39. On the other hand, the top portions of the uneven structure of the transparent conductive film 28Z are not covered with the resin film 40 and are exposed. The top portions are disposed between the first metal electrode layer 29 and the second metal electrode layer 39.

Similarly to the comparative example, the first metal electrode layer 29 and the second metal electrode layer 39 made of the conductive paste may have urethane bonds. Through the above steps, the back electrode type solar cell 1 of the present embodiment is completed.

The method of manufacturing a solar cell according to the present embodiment includes the metal electrode layer uncured film forming step and the transparent electrode layer forming step in this order after the transparent conductive film forming step. In the transparent electrode layer forming step, the transparent conductive film 28Z is patterned using the uncured film 29Z of the first metal electrode layer and the uncured film 39Z of the second metal electrode layer formed by the metal electrode layer uncured film forming step as masks. Thus, the first transparent electrode layer 28 and the second transparent electrode layer 38 separated from each other are formed. As a result, in the method of manufacturing the solar cell of the present embodiment as well, it is not necessary to use a photolithography method or the like using a mask as in the conventional method of manufacturing the solar cell of the comparative example described above. Therefore, it is possible to simplify and shorten the formation of the transparent electrode layer. As a result, it is possible to reduce the cost of the solar cell and the solar cell module.

Further, according to the method of manufacturing the solar cell of the present embodiment, in the metal electrode layer uncured film forming step prior to the transparent electrode layer forming step, the uncured films 29Z and 39Z of the metal electrode layer are only dried (e.g., 150 degrees, 3 minutes). Then, in the metal electrode layer forming step after the transparent electrode layer forming step, the metal electrode layers 29 and 39 are fired, for example, at 180 degrees for 60 minutes. As a result, it is possible to reduce the deterioration in the performance of the solar cell as compared with the method of manufacturing the solar cell of the above-described comparative example. This is presumed to be due to the following reasons.

Also in the method of manufacturing the solar cell of the present embodiment, as described above, in the etching of the transparent electrode layer 28 (38) (transparent electrode layer forming step), under the condition of the hydrochloric acid immersion necessary for etching the portion 28*a* (38*a*) of the interface with the semiconductor substrate 11, the end of the other portion is etched more than necessary (side etching).

Figure 5:
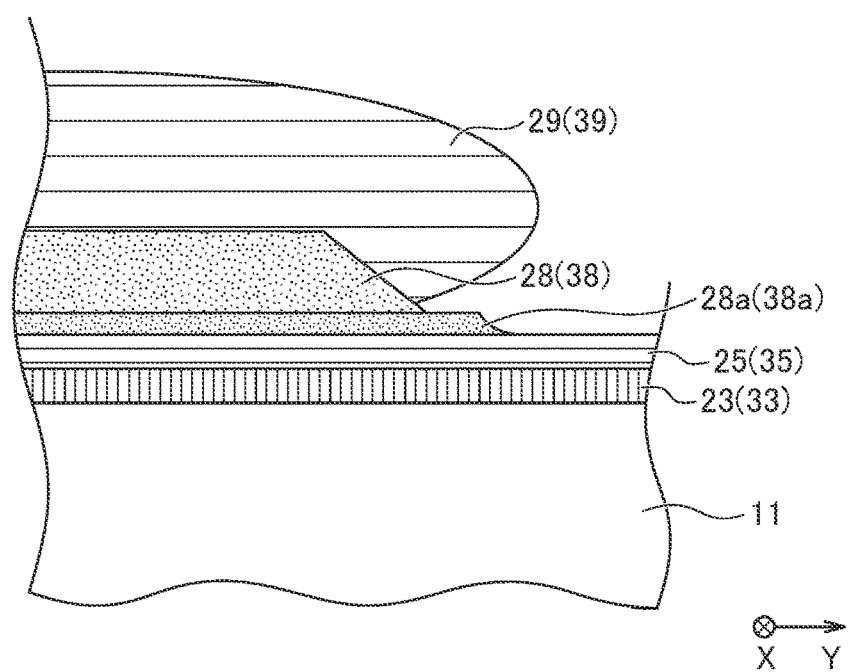
FIG. 5 is a diagram showing enlarged end portions of the transparent electrode layer and the metal electrode layer in the solar cell according to the present embodiment.

However, in the manufacturing method of the solar cell of the present embodiment, it is presumed that, when the metal electrode layer 29 (39) is fired after etching (transparent electrode layer forming step) of the transparent electrode layer 28 (38) (metal electrode layer forming step), the metal electrode layer 29 (39) covers the end surface of the transparent electrode layer 28 (38), as shown in FIG. 5, such that the reduction in the contact area between the transparent electrode layer 28 (38) and the metal electrode layer 29 (39) can be recovered.

Here, in the same manner as described above, when the uncured film 29Z of the first metal electrode layer and the uncured film 39Z of the second metal electrode layer are used as masks to pattern the transparent conductive film 28Z, the transparent conductive film 28Z under the uncured film 29Z of the first metal electrode layer and the uncured film 39Z of the second metal electrode layer are also etched during etching of the transparent conductive film 28Z. As a result, there is a possibility that the first transparent electrode layer 28 and the uncured film 29Z of the first metal electrode layer, and the second transparent electrode layer 38 and the uncured film 29Z of the second metal electrode layer are peeled off.

In this regard, also in the method of manufacturing the solar cell of the present embodiment, similarly to the method of manufacturing the solar cell of the comparative example, a printing material containing a particulate metal material, a resin material, and a solvent is printed and allowed to dry in the metal electrode layer uncured film forming step. As a result, the resin film 40 is formed on the periphery of the uncured film 29Z of the first metal electrode layer and the periphery of the uncured film 39Z of the second metal electrode layer. This resin film 40 is made by unevenly distributing the resin material. Further, in the transparent electrode layer forming step, the transparent conductive film 28Z is patterned using the uncured film 29Z of the first metal electrode layer and the resin film 40 at the periphery thereof, and the uncured film 39Z of the second metal electrode layer and the resin film 40 at the periphery thereof as masks. As a result, etching of the transparent conductive film 28Z below the uncured film 29Z of the first metal electrode layer and the uncured film 39Z of the second metal electrode layer is suppressed. As a result, peeling of the uncured film 29Z of the first transparent electrode layer 28 and the first metal electrode layer is suppressed. Further, peeling of the uncured film 39Z of the second transparent electrode layer 38 and the second metal electrode layer is suppressed.

In the solar cell 1 manufactured by the method of manufacturing the solar cell of the present embodiment as well, similarly to the comparative example, the band width of the first transparent electrode layer 28 is narrower than the band width of the first metal electrode layer 29. The band width of the second transparent electrode layer 38 is narrower than the band width of the second metal electrode layer 39. Furthermore, a resin film is formed on the periphery of the first metal electrode layer 29 and the periphery of the second metal electrode layer 39. This resin film is made by the resin material in the printing material of the first metal electrode layer 29 and the second metal electrode layer 39 being unevenly distributed. It should be noted that, in a solar cell manufactured by a conventional method of manufacturing a solar cell, generally, the band width of the transparent electrode layer is wider than the band width of the metal electrode layer.

Also in the solar cell 1 manufactured by the manufacturing method of the present embodiment, as in the comparative example, a portion of the first conductivity type semiconductor layer 25 and a portion of the second conductivity type semiconductor layer 35 are covered with the resin film 40. A portion of the first conductivity type semiconductor layer 25 and a portion of the second conductivity type semiconductor layer 35 are disposed between the first metal electrode layer 29 and the second metal electrode layer 39. In detail, the valley portions of the uneven structure (texture structure) of the first conductivity type semiconductor layer 25 and the valley portions of the uneven structure of the second conductivity type semiconductor layer 35 are covered with the resin film 40. These valley portions are arranged between the first metal electrode layer 29 and the second metal electrode layer 39.

Furthermore, between the first conductivity type semiconductor layer 25 and the resin film 40, the transparent conductive film 48 is disposed (discontinuous) in an island-like shape. Between the second conductivity type semiconductor layer 35 and the resin film 40, the transparent conductive film 48 is arranged in island-like shape (discontinuous). The transparent conductive film 48 is made of the same material as the first transparent electrode layer 28 and the second transparent electrode layer 38, for example. In detail, between the valley portion of the uneven structure of the first conductivity type semiconductor layer 25 and the resin film 40, the transparent conductive film 48 is disposed in an island-like shape. Between the valley portion of the uneven structure of the second conductivity type semiconductor layer 35 and the resin film 40, the transparent conductive film 48 is disposed in an island-like shape. Thus, the area where the first conductivity type semiconductor layer 25 and the second conductivity type semiconductor layer 35 are exposed is reduced. Therefore, deterioration of the solar cell and the solar cell module is suppressed. As a result, the reliability (e.g., long-term durability) of the solar cell and the solar cell module is improved.

While embodiments of the present disclosure have been described above, the present disclosure is not limited to the above-described embodiments, and various changes and modifications can be made. For example, in the embodiment described above, as shown in FIG. 3, the heterojunction type solar cell 1 is exemplified. However, the present disclosure is not limited to heterojunction type solar cells, and can be applied to various solar cells such as homojunction type solar cells.

In the embodiment described above, the solar cell having the crystalline silicon substrate is exemplified. However, the present disclosure is not limited thereto. For example, the solar cell may have a gallium-arsenide (GaAs) substrate.

EXAMPLES

Hereinafter, the present disclosure will be specifically described based on Examples, but the present disclosure is not limited to the following Examples.

Example 1

The solar cell 1 and the solar cell module 100 shown in FIGS. 1 to 3 were manufactured by the method of manufacturing the solar cell shown in FIGS. 4A to 4E. The main features of the manufacturing method of the solar cell of Example 1 are as follows and as in Table 1.

(Ag drying→ITO-etching→Ag firing)

Transparent conductive film forming step:

Transparent conductive film: ITO (Indium Tin Oxide: complex oxide of indium oxide and tin oxide), 100 nm thick Metal electrode layer uncured film forming step:
Material of the uncured film of the metal electrode layer: Ag paste, drying temperature: 150 degrees, drying time: 3 minutes
Transparent electrode layer forming step:
Etching solution: HCl, concentration: 35%, etching time: 140 seconds
Metal electrode layer forming step:
Firing temperature: 180 degrees, firing time: 60 minutes Example 2

The drying temperature in the metal electrode layer uncured film forming step is different from that in Example 1. The main features of the manufacturing method of the solar cell of Example 2 are as follows and as in Table 1.
(Ag drying→ITO-etching→Ag firing)
Metal electrode layer uncured film forming step:
Material of the uncured film of the metal electrode layer: Ag paste, drying temperature: 140 degrees, drying time: 3 minutes Example 3

The drying temperature in the metal electrode layer uncured film forming step is different from that in Example 1. The main features of the manufacturing method of the solar cell of Example 3 are as follows and as in Table 1.
(Ag drying→ITO-etching→Ag firing)
Metal electrode layer uncured film forming step:
Material of the uncured film of the metal electrode layer: Ag paste, drying temperature: 130 degrees, drying time: 3 minutes Example 4

The drying temperature in the metal electrode layer uncured film forming step is different from that in Example 1. The main features of the manufacturing method of the solar cell of Example 4 are as follows and as in Table 1.
(Ag drying→ITO-etching→Ag firing)
Metal electrode layer uncured film forming step:
Material for the uncured film of the metal electrode layer: Ag paste, drying temperature: 120 degrees, drying time: 3 minutes Example 5

The concentration of the etchant and the etching time in the transparent electrode layer forming step are different from that in Example 1. The main features of Example 5 are as follows and as in Table 1.
(Ag drying→ITO-etching→Ag firing)
Transparent electrode layer forming step:
Etching solution: HCl, concentration: 12%, etching time: 490 seconds Comparative Example 1

Solar cells and solar cell modules were manufactured using a conventional photolithography method. The main features of the manufacturing method of the solar cell of Comparative Example 1 are as follows and as in Table 1.
Transparent conductive film forming step:
Material of transparent conductive film: Indium tin oxide (ITO), film thickness: 100 nm Transparent electrode layer forming step:
Etching solution: HCl, concentration: 35%, etching time: 45 seconds
Metal electrode layer forming step:
Material of metal electrode layer: Ag paste, firing temperature: 180 degrees, firing time: 60 minutes Comparative Example 2

The order of the transparent electrode layer forming step and the metal electrode layer forming step is different from that in Example 1. The main features of the manufacturing method of the solar cell of Comparative Example 2 are as follows and as in Table 1.
(Ag drying→Ag firing→ITO-etching)
Transparent conductive film forming step:
Material of transparent conductive film: Indium tin oxide (ITO), film thickness: 100 nm
Metal electrode layer uncured film forming step:
Material of the uncured film of the metal electrode layer: Ag paste, drying temperature: 150 degrees, drying time: 3 minutes
Metal electrode layer forming step:
Firing temperature: 180 degrees, firing time: 60 minutes
Transparent electrode layer forming step:
Etching solution: HCl, concentration: 35%, etching time: 140 seconds Pseudo-sunlight was irradiated at 100 mW/cm$^2$ energy densities at 25° C. using a pulsed solar simulator with a spectral profile of AM1.5. Then, the performance characteristics of the solar cell of the above Examples and Comparative Examples (short-circuit current Isc, open-circuit voltage Voc, curve factor FF, and conversion efficiency Eff) were measured. The measurement results are shown in Table 1. In Table 1, the output characteristic results of Comparative Example 1 were used as a reference (1.00), and the correlation of the outputs was evaluated by comparing the evaluation results of the respective Examples. Regarding warpage, the substrate just before ITO etching was placed on a horizontal table, and the distance between the substrate edge and the base in the state where the center of the substrate touched the base was measured by a ruler.

TABLE 1

| | STEPS | DRYING TEMPERATURE [degrees] | HCl TEMPERATURE [%] | ETCHING TIME [sec] | Jsc | Voc | FF | Eff | WARPAGE BEFORE ITO ETCHING [mm] |
|---|---|---|---|---|---|---|---|---|---|
| Example 1 | Ag DRYING → ITO ETCHING → Ag FIRING | 150 | 35 | 140 | 0.98 | 1.00 | 1.00 | 0.98 | 0 |
| Example 2 | Ag DRYING → ITO ETCHING → Ag FIRING | 140 | 35 | 140 | 0.98 | 1.00 | 0.85 | 0.83 | 0 |

TABLE 1-continued

| | STEPS | DRYING TEMPER- ATURE [degrees] | HCl TEMPER- ATURE [%] | ETCHING TIME [sec] | Jsc | Voc | FF | Eff | WARPAGE BEFORE ITO ETCHING [mm] |
|---|---|---|---|---|---|---|---|---|---|
| Example 3 | Ag DRYING → ITO ETCHING → Ag FIRING | 130 | 35 | 140 | 0.96 | 0.99 | 0.60 | 0.57 | 0 |
| Example 4 | Ag DRYING → ITO ETCHING → Ag FIRING | 120 | 35 | 140 | 0.72 | 0.99 | 0.36 | 0.26 | 0 |
| Example 5 | Ag DRYING → ITO ETCHING → Ag FIRING | 150 | 12 | 490 | 1.01 | 0.99 | 1.00 | 1.00 | 0 |
| Comparative Example 1 | PHOTOLI- THOGRAPHY | — | 35 | 45 | 1.00 | 1.00 | 1.00 | 1.00 | 0 |
| Comparative Example 2 | Ag DRYING → Ag FIRING → ITO ETCHING | — | 35 | 140 | 0.99 | 1.01 | 0.98 | 0.98 | 2 |

According to Comparative Example 2, FF and Eff were reduced as compared with Comparative Example 1. This is because the Ag paste was fired following which the transparent conductive film (28Z) was etched using the Ag electrode (29, 39) as a mask, a result of which the end portion of the transparent electrode layer (28,38) was etched more than necessary, as shown in FIG. 7 (side etching). As a result, it is presumed that the contact area between the transparent electrode layers (28, 38) and the metal electrode layers (29, 39) decreased.

According to Example 1, as compared with Comparative Example 2, the decrease in FF was reduced. The Ag paste (29Z, 39Z) was only dried (e.g., 150 degrees, 3 minutes) prior to the etching of the transparent conductive film (28Z), and the Ag paste (29, 39) was fired (e.g., 180 degrees, 60 minutes) after the etching of the transparent conductive film (28Z), so that the metal electrode layers (29, 39) covered the end faces of the transparent electrode layers (28, 38), as shown in FIG. 5. As a result, it is presumed that the decrease in the contact area between the transparent electrode layers (28, 38) and the metal electrode layers (29, 39) were recovered and the decrease in the series resistance of the solar cell was recovered.

According to Examples 1 to 4, it can be appreciated that, as the drying temperature of the uncured films 29Z and 39Z of the metal electrode layer in the metal electrode layer uncured film forming step is closer to 150 degrees, the decrease in FF and Eff is reduced. When the Ag paste (29Z, 39Z) is not sufficiently dried prior to etching of the transparent conductive film (28Z), hydrochloric acid infiltrates below the Ag paste (29Z, 39Z). As a result, it is presumed that the contact area between the transparent electrode layers (28, 38) and the metal electrode layers (29, 39) decreased, and the series resistance of the solar cell increased.

According to Example 5, the decrease in FF and Eff was reduced as compared with Comparative Example 2. Incidentally, with a longer etching time, it is expected that the etching of the edge of the transparent electrode layer (28,38) progresses. Therefore, according to the method of manufacturing the solar cell of the present disclosure, as described above, the metal electrode layers (29, 39) covered the end faces of the transparent electrode layers (28, 38), as shown in FIG. 5. As a result, it is presumed that the decrease in the contact area between the transparent electrode layer (28, 38) and the metal electrode layer (29, 39) was recovered, and the decrease in the series resistance of the solar cell was recovered.

According to Examples 1 to 5, the warpage of the substrate immediately before the ITO etching was small as compared with Comparative Example 2. The Ag drying alone caused almost no warpage of the substrate, and it is presumed that warpage was caused by the Ag firing. It is considered that the small warpage of the substrate immediately before the ITO etching contributed to smoothly performing the loading and unloading steps of the substrate to and from the cassette when, for example, a plurality of substrates are set in the same cassette and the ITO etching step is performed in mass production.

What is claimed is:

1. A method of manufacturing a back electrode type solar cell, the method comprising:
   forming a first conductivity type semiconductor layer on a portion of one main surface side of a semiconductor substrate, and forming a second conductivity type semiconductor layer on one other portion of the one main surface side of the semiconductor substrate;
   forming a transparent conductive film on and across the first conductivity type semiconductor layer and the second conductivity type semiconductor layer;
   printing and drying a printing material to form an uncured film of a first metal electrode layer on the first conductivity type semiconductor layer with the transparent conductive film interposed therebetween and to form an uncured film of a second metal electrode layer on the second conductivity type semiconductor layer with the transparent conductive film interposed therebetween, wherein the printing material contains metal material particles, a resin material, and a solvent;
   patterning the transparent conductive film using the uncured film of the first metal electrode layer and the uncured film of the second metal electrode layer as masks to form a first transparent electrode layer and a second transparent electrode layer separated from each other; and
   firing and curing the uncured film of the first metal electrode layer and the uncured film of the second metal electrode layer to form a first metal electrode layer and a second metal electrode layer, wherein
   the back electrode type solar cell includes:
   the semiconductor substrate,
   the first conductivity type semiconductor layer and the second conductivity type semiconductor layer disposed on the one main surface side of the semiconductor substrate, the first transparent electrode layer and the first metal electrode layer corresponding to the first conductivity type semiconductor layer, and the second transparent electrode layer and the second metal electrode layer corresponding to the second conductivity type semiconductor layer.

2. The method of manufacturing a solar cell according to claim 1, wherein a temperature of the firing of the uncured film of the first metal electrode layer and the uncured film of the second metal electrode layer is from 160 degrees to 200 degrees, and a time of the firing is from 30 minutes to 120 minutes, and a temperature of the drying the printing material is lower than the temperature of the firing, and a time of the drying is shorter than the time of the firing.

3. The method of manufacturing a solar cell according to claim 2, wherein the temperature of the drying is from 120 degrees to 180 degrees, and the time of the drying is from 1 minute to 20 minutes.

4. The method of manufacturing a solar cell according to claim 1, further comprising forming a resin film on a periphery of the uncured film of the first metal electrode layer and a periphery of the uncured film of the second metal electrode layer, the resin film being formed by unevenly distributing the resin material, wherein the patterning the transparent conductive film includes using the uncured film of the first metal electrode layer and the resin film at the periphery thereof, and the uncured film of the second metal electrode layer and the resin film at the periphery thereof as masks, and forming a resin film on the periphery of the first metal electrode layer and the periphery of the second metal electrode layer, the resin film being formed by unevenly distributing the resin material.

5. The method of manufacturing a solar cell according to claim 1, wherein the patterning the transparent conductive film includes a wet etching method using an etching solution.

6. The method of manufacturing a solar cell according to claim 1, wherein the printing the printing material includes a screen printing method.

7. The method of manufacturing a solar cell according to claim 1, wherein a ratio of the metal material particles contained in the printing material is from 85% to 95% as a weight ratio relative to the printing material overall.

8. The method of manufacturing a solar cell according to claim 2, further comprising forming a resin film on a periphery of the uncured film of the first metal electrode layer and a periphery of the uncured film of the second metal electrode layer, the resin film being formed by unevenly distributing the resin material, wherein the patterning the transparent conductive film includes using the uncured film of the first metal electrode layer and the resin film at the periphery thereof, and the uncured film of the second metal electrode layer and the resin film at the periphery thereof as masks, and forming a resin film on the periphery of the first metal electrode layer and the periphery of the second metal electrode layer, the resin film being formed by unevenly distributing the resin material.

9. The method of manufacturing a solar cell according to claim 3, further comprising forming a resin film on a periphery of the uncured film of the first metal electrode layer and a periphery of the uncured film of the second metal electrode layer, the resin film being formed by unevenly distributing the resin material, wherein the patterning the transparent conductive film includes using the uncured film of the first metal electrode layer and the resin film at the periphery thereof, and the uncured film of the second metal electrode layer and the resin film at the periphery thereof as masks, and forming a resin film on the periphery of the first metal electrode layer and the periphery of the second metal electrode layer, the resin film being formed by unevenly distributing the resin material.

10. The method of manufacturing a solar cell according to claim 2, wherein the patterning the transparent conductive film includes a wet etching method using an etching solution.

11. The method of manufacturing a solar cell according to claim 3, wherein the patterning the transparent conductive film includes a wet etching method using an etching solution.

12. The method of manufacturing a solar cell according to claim 4, wherein the patterning the transparent conductive film includes a wet etching method using an etching solution.

13. The method of manufacturing a solar cell according to claim 2, wherein the printing the printing material includes a screen printing method.

14. The method of manufacturing a solar cell according to claim 3, wherein the printing the printing material includes a screen printing method.

15. The method of manufacturing a solar cell according to claim 4, wherein the printing the printing material includes a screen printing method.

16. The method of manufacturing a solar cell according to claim 5, wherein the printing the printing material includes a screen printing method.

17. The method of manufacturing a solar cell according to claim 2, wherein a ratio of the metal material particles contained in the printing material is from 85% to 95% as a weight ratio relative to the printing material overall.

18. The method of manufacturing a solar cell according to claim 3, wherein a ratio of the metal material particles contained in the printing material is from 85% to 95% as a weight ratio relative to the printing material overall.

19. The method of manufacturing a solar cell according to claim 4, wherein a ratio of the metal material particles contained in the printing material is from 85% to 95% as a weight ratio relative to the printing material overall.

20. The method of manufacturing a solar cell according to claim 5, wherein
a ratio of the metal material particles contained in the printing material is from 85% to 95% as a weight ratio relative to the printing material overall.

* * * * *